(12) United States Patent
Zhou et al.

(10) Patent No.: US 12,106,972 B2
(45) Date of Patent: Oct. 1, 2024

(54) SELECTIVE SILICON DEPOSITION

(71) Applicant: Applied Materials, Inc., Santa Clara, CA (US)

(72) Inventors: Yifeng Zhou, Fremont, CA (US); Qian Fu, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2 days.

(21) Appl. No.: 17/500,664

(22) Filed: Oct. 13, 2021

(65) Prior Publication Data

US 2023/0110474 A1 Apr. 13, 2023

(51) Int. Cl.
*H01L 21/3205* (2006.01)
*C23C 16/24* (2006.01)
(Continued)

(52) U.S. Cl.
CPC ........ *H01L 21/32055* (2013.01); *C23C 16/24* (2013.01); *C23C 16/401* (2013.01);
(Continued)

(58) Field of Classification Search
None
See application file for complete search history.

(56) References Cited

U.S. PATENT DOCUMENTS

2002/0197402 A1* 12/2002 Chiang ............... C23C 16/0227 257/E21.171
2013/0260561 A1 10/2013 Ranjan et al.
(Continued)

FOREIGN PATENT DOCUMENTS

WO 2020223011 A1 11/2020
WO 2021-188340 A1 9/2021

OTHER PUBLICATIONS

P. Vanelderen et al., "The role of underlayers in EUVL", Journal of Photopolymer Science and Technology, vol. 31, pp. 209-214. (Year: 2018).*

(Continued)

*Primary Examiner* — Jiong-Ping Lu
(74) *Attorney, Agent, or Firm* — Kilpatrick Townsend & Stockton LLP

(57) ABSTRACT

Exemplary semiconductor processing methods may include providing a silicon-containing precursor to a processing region of a semiconductor processing chamber. A substrate may be disposed within the processing region. The substrate may include one or more patterned features separated by exposed regions of the substrate. The methods may include providing a hydrogen-containing precursor to the processing region of the semiconductor processing chamber. The methods may include forming a plasma of the silicon-containing precursor and the hydrogen-containing precursor. Forming the plasma of the silicon-containing precursor and the hydrogen-containing precursor may be performed at a plasma power of less than or about 1,000 W. The methods may include depositing a silicon-containing material on the one or more patterned features along the substrate. The silicon-containing material may be deposited on the patterned features at a rate of at least 2:1 relative to deposition on the exposed regions of the substrate.

19 Claims, 4 Drawing Sheets

(51) Int. Cl.
  *C23C 16/40*      (2006.01)
  *C23C 16/50*      (2006.01)
  *H01L 21/02*      (2006.01)
  *H01L 21/311*     (2006.01)
  *H01L 21/3213*    (2006.01)

(52) U.S. Cl.
  CPC ........ *C23C 16/50* (2013.01); *H01L 21/02123* (2013.01); *H01L 21/02274* (2013.01); *H01L 21/31105* (2013.01); *H01L 21/31116* (2013.01); *H01L 21/32137* (2013.01)

(56) References Cited

U.S. PATENT DOCUMENTS

| | | | |
|---|---|---|---|
| 2014/0051256 A1* | 2/2014 | Zhong | H01L 29/66795 |
| | | | 438/723 |
| 2017/0178899 A1* | 6/2017 | Kabansky | H01L 21/0335 |
| 2018/0233357 A1 | 8/2018 | Kabansky et al. | |
| 2021/0134983 A1* | 5/2021 | Lin | H01L 21/02326 |
| 2021/0183656 A1* | 6/2021 | Lutker-Lee | H01L 21/0338 |
| 2021/0254210 A1 | 8/2021 | Shen et al. | |
| 2021/0391181 A1* | 12/2021 | Chang | H01L 21/31144 |

OTHER PUBLICATIONS

Application No. PCT/US2022/046165, International Search Report and the Written Opinion, Mailed on Feb. 9, 2023, 11 pages.

* cited by examiner

SELECTIVE SILICON DEPOSITION

TECHNICAL FIELD

The present technology relates to semiconductor systems, processes, and equipment. More specifically, the present technology relates to processes and systems to selectively deposit silicon-containing material.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing includes etching material to form recessed features. However, this etching may produce unwanted structures in the recessed features or in the materials near the recessed features. Developing materials that can avoid the formation of unwanted side effects has been challenging.

Thus, there is a need for improved systems and methods that can be used to produce high quality devices and structures. These and other needs are addressed by the present technology.

SUMMARY

Exemplary semiconductor processing methods may include providing a silicon-containing precursor to a processing region of a semiconductor processing chamber. A substrate may be disposed within the processing region of the semiconductor processing chamber. The substrate may include one or more patterned features separated by exposed regions of the substrate. The methods may include providing a hydrogen-containing precursor to the processing region of the semiconductor processing chamber. The methods may include forming a plasma of the silicon-containing precursor and the hydrogen-containing precursor. Forming the plasma of the silicon-containing precursor and the hydrogen-containing precursor may be performed at a plasma source power of less than or about 1,000 W. The methods may include depositing a silicon-containing material on the one or more patterned features along the substrate. The silicon-containing material may be deposited on the patterned features at a rate of at least 2:1 relative to deposition on the exposed regions of the substrate.

In some embodiments, the silicon-containing material may be or include silicon tetrachloride ($SiCl_4$). The one or more patterned features may be or include tin oxide, silicon, silicon oxide, silicon oxynitride, or silicon-containing antireflective layer (SiARC). The one or more patterned features may overly a carbon-containing layer. The one or more patterned features may protrude greater than or about 5 nm from the carbon-containing layer. A temperature within the semiconductor processing chamber may be maintained at less than or about 100° C. while depositing the silicon-containing material on the one or more patterned features. A pressure within the semiconductor processing chamber may be maintained at less than or about 50 mTorr while depositing the silicon-containing material on the one or more patterned features. The methods may include applying a bias power to the processing region of the semiconductor processing chamber while depositing the silicon-containing material on the one or more metal-containing features. The bias power may be less than or about 100 W.

Some embodiments of the present technology may encompass semiconductor processing methods. The methods may include providing a silicon-containing precursor to a processing region of a semiconductor processing chamber. A substrate may be disposed within the processing region of the semiconductor processing chamber. The substrate may define one or more patterned features along the substrate. The methods may include forming a plasma of the silicon-containing precursor. Forming the plasma of the silicon-containing precursor may be performed at a plasma power of less than or about 1,000 W. The methods may include depositing a discontinuous silicon-containing layer on the substrate. The silicon-containing layer may be selectively deposited on the one or more patterned features along the substrate.

In some embodiments, a temperature within the semiconductor processing chamber may be maintained at less than or about 75° C. while depositing the silicon-containing material. A pressure within the semiconductor processing chamber may be maintained at less than or about 50 mTorr while depositing the silicon-containing material. The methods may include etching one or more recesses into a carbon-containing layer deposited on the substrate with a plasma of an oxygen-containing precursor subsequent depositing the discontinuous silicon-containing layer on the substrate. The oxygen-containing precursor may be or include diatomic oxygen. Subsequent the etching, the one or more recesses may be characterized by an undercut of less than or about 2 nm.

Some embodiments of the present technology may encompass semiconductor processing methods. The methods may include providing a silicon-containing precursor and a hydrogen-containing precursor to a processing region of a semiconductor processing chamber. A substrate may be disposed within the processing region of the semiconductor processing chamber. The substrate may include a layer of carbon-containing material. The substrate may include a patterned metal-containing photoresist overlying the layer of carbon-containing material. At least a portion of the layer of carbon-containing material may be exposed through the patterned metal-containing photoresist. The methods may include forming a plasma of the silicon-containing precursor and the hydrogen-containing precursor. Forming the plasma of the silicon-containing precursor and the hydrogen-containing precursor may be performed at a plasma power of less than or about 1,000 W. The methods may include depositing a silicon-containing material on the patterned metal-containing photoresist along the substrate. The methods may include providing an oxygen-containing precursor to the processing region of the semiconductor processing chamber. The methods may include forming a plasma of the oxygen-containing precursor. The methods may include etching one or more recesses with the plasma of the oxygen-containing precursor.

In some embodiments, the silicon-containing material is silicon tetrachloride ($SiCl_4$). The methods may include applying a bias power to the processing region of the semiconductor processing chamber while depositing the silicon-containing material on the patterned metal-containing photoresist. The bias power may be less than or about 100 W. The methods may include reducing a pressure in the semiconductor processing chamber prior to providing the oxygen-containing precursor to the processing region of the semiconductor processing chamber. Forming the plasma of the oxygen-containing precursor may be performed at a plasma power of greater than or about 300 W.

Such technology may provide numerous benefits over conventional methods and techniques. For example, the processes may deposit silicon-containing material selectively on non-carbon material, such as metal-containing or silicon-containing features. Additionally, the processes may reduce or limit removal of the patterned features or undercut when etching recesses in materials underlying the patterned features. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
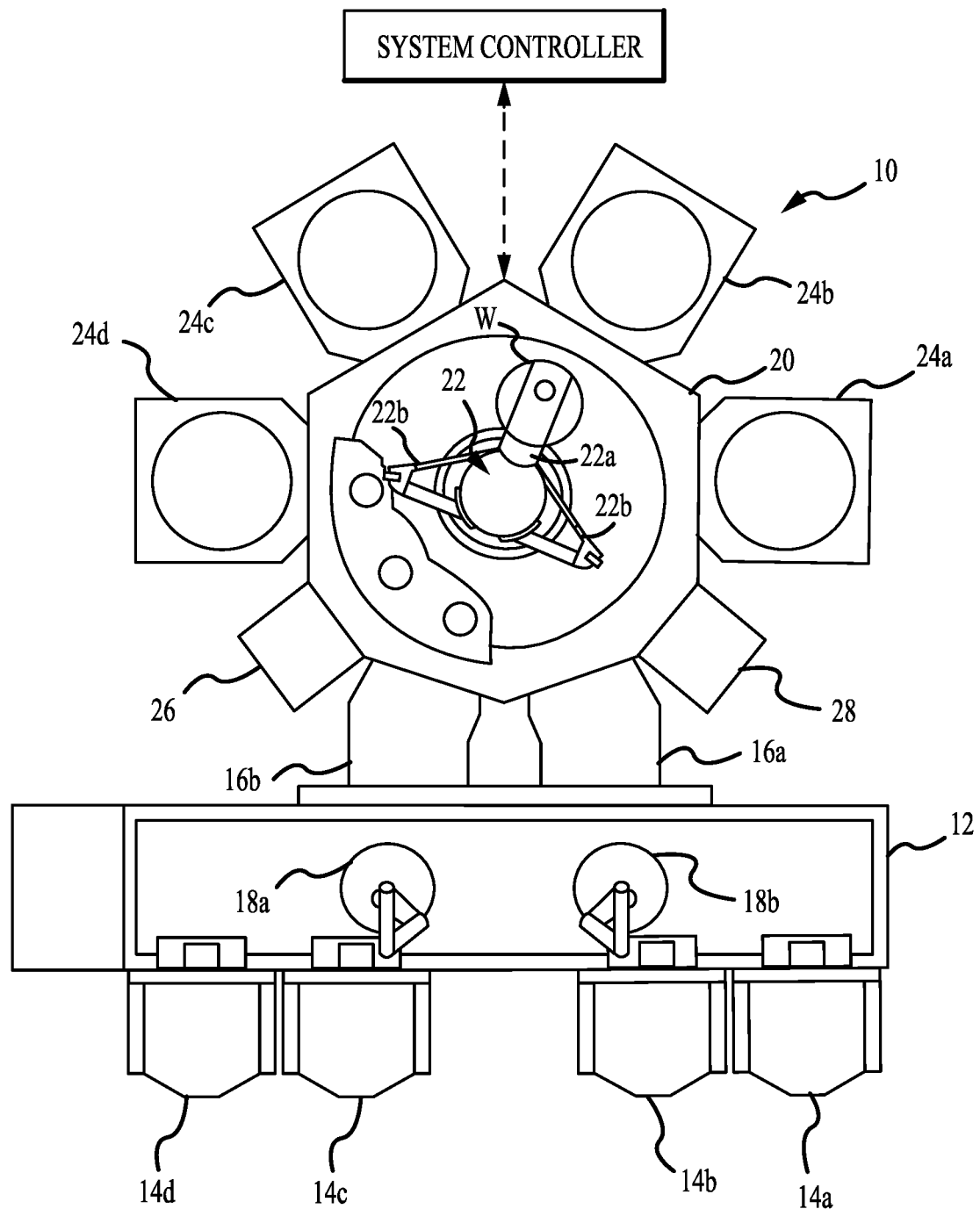
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and width and size to scale devices. As features within semiconductor structures may be reduced in size, it may be more difficult to perform various processes such as lithography, deposition, and etching while maintaining structural integrity.

Conventional technologies have struggled to etch recesses between patterned features, such as metal oxide photoresists. Metal oxide photoresists may be valuable for a number of etch processes, however, the films are formed to far lower thicknesses than conventional photoresist materials. Accordingly, etch processes for patterning materials two or three times the thickness of the metal oxide photoresist may cause the photoresist to be removed or altered, which can lead to tapered etch profiles, or incomplete processing. Etching recesses may undesirably etch the patterned features themselves, may undercut the features, or may etch recesses with angled sidewalls. Any of these side effects during etching may result in undesirable structures. Furthermore, conventional technologies may require performing an etching process in one chamber, breaking vacuum and transferring the structure, and performing the deposition process in a separate chamber. This transfer may allow for undesirable contamination during processing. Accordingly, many conventional technologies have been limited in the ability to prevent structural flaws in the final devices.

The present technology overcomes these issues by depositing a silicon-containing material over a metal oxide photoresist material or other silicon-containing material, such as selectively on the patterned features. The deposition may be performed in the same chamber as the etch process, which may limit queue times and improve structural integrity by limiting exposure to atmosphere. By depositing a silicon-containing material as a protective layer on the patterned features, the present technology may ensure the photoresist may remain intact during processing. During subsequent etch processes, the silicon-containing material may serve to protect the patterned material from being removed and serve as a second mask for recessing into underlying materials deposited on the substrate. By depositing silicon-containing material, the present technology may prevent problems in any following integration processes and/or defects in the final devices.

Although the remaining disclosure will routinely identify specific deposition and etching processes utilizing the disclosed technology, it will be readily understood that the systems and methods are equally applicable to a variety of other processes as may occur in the described chambers. Accordingly, the technology should not be considered to be so limited as for use with the described deposition or etching processes alone. The disclosure will discuss one possible system and chamber that can be used with the present technology before describing systems and methods or operations of exemplary process sequences according to some embodiments of the present technology. It is to be understood that the technology is not limited to the equipment described, and processes discussed may be performed in any number of processing chambers and systems.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
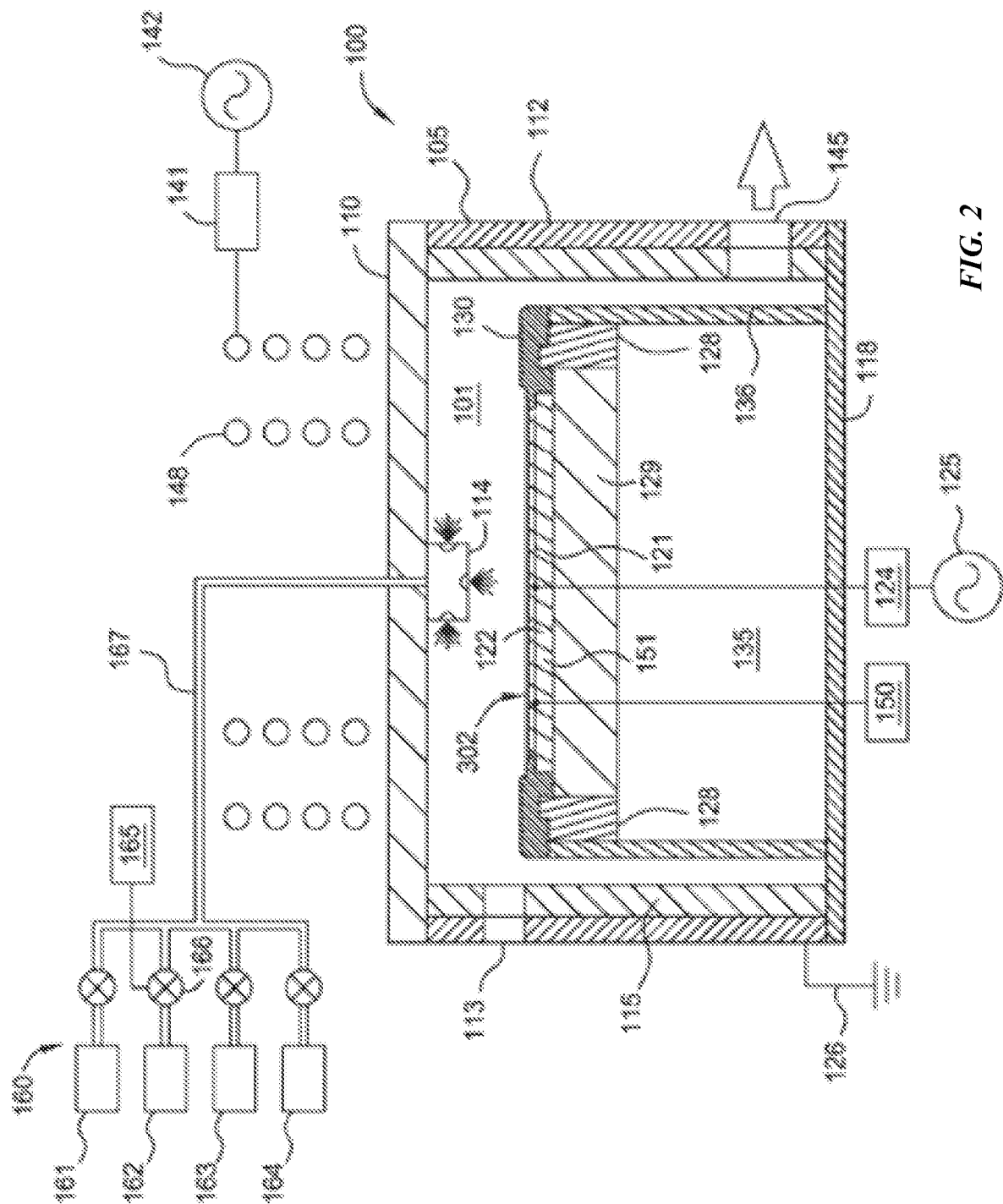
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
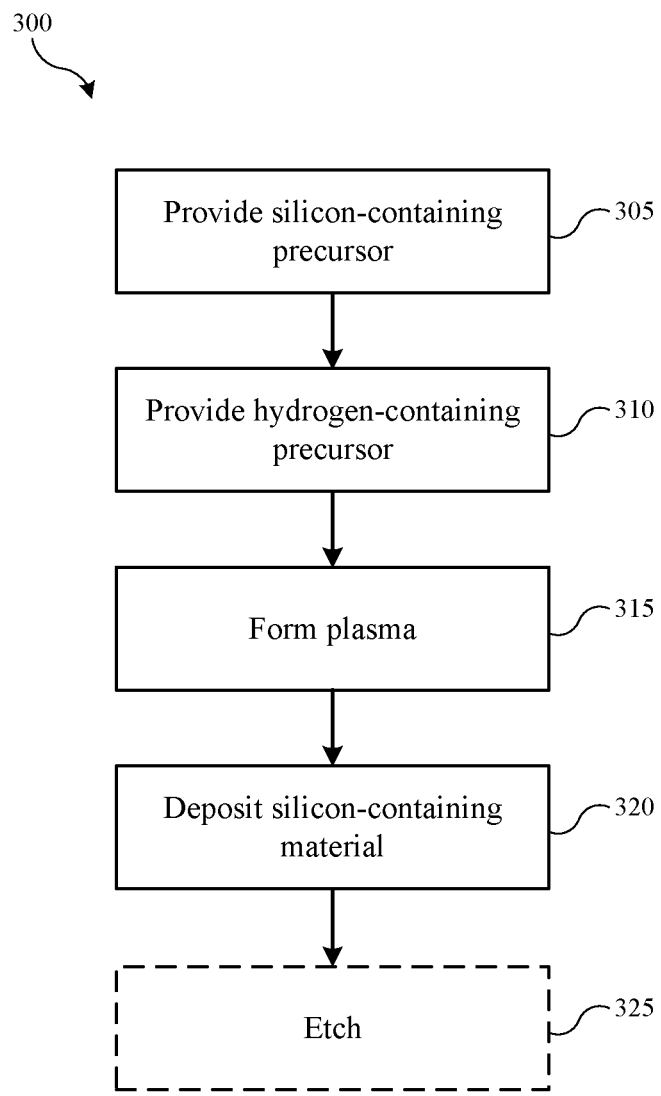
FIG. 3 shows selected operations in a semiconductor processing method according to some embodiments of the present technology.

The processing chambers explained above may be used during methods according to embodiments of the present technology. FIG. 3 illustrates a method 300 of semiconductor processing, operations of which may be performed, for example, in one or more chambers 100 incorporated on multi-chamber processing system 10 as previously described. Any other chamber may also be utilized, which may perform one or more operations of any method or process described. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may include a number of operations that may be performed in a number of variations, such as including beginning at different operations of processing. Method 300 may generally include a deposition operation that may occur in chambers in which etch processes may be performed. Often, the deposition may be performed prior to the etching. Accordingly, although method 300 will be described in a particular order, it is to be understood that the method may be performed in a number of different variations according to embodiments of the present technology. Method 300 may describe operations shown schematically in FIGS. 4A-4C, the illustrations of which will be described in conjunction with the operations of method 300. It is to be understood that structure 400 in FIGS. 4A-4C illustrates only partial schematic views, and a substrate 405 may contain any number of structural sections having aspects as illustrated in the figures, as well as alternative structural aspects that may still benefit from operations of the present technology.

A substrate 405 may be disposed within the processing region of the semiconductor processing chamber 100, or any other processing chamber in which operations of the present technology may be performed. The substrate 405 may have a substantially planar surface or an uneven surface in embodiments. The substrate 405 may be a material such as crystalline silicon, silicon oxide, strained silicon, silicon germanium, silicon oxycarbide, silicon oxycarbonitride, silicon carbonitride, doped or undoped polysilicon, doped or undoped silicon wafers, patterned or non-patterned wafers, silicon on insulator, carbon doped silicon oxides, silicon nitride, doped silicon, germanium, gallium arsenide, or sapphire. The substrate 405 may have various dimensions, such as 200 mm or 300 mm diameter wafers, as well as rectangular or square panels. As shown in FIG. 4A, the substrate 405 may include one or more patterned features 415, such as a patterned metal-containing photoresist, separated by exposed regions of the substrate 405. That is, the patterned material may be a patterned metal-containing photoresist. The patterned features 415 may be or include any number of metals. For example, the patterned features 415 may include metal oxides, or any material consisting of a metal and oxygen. In embodiments, the patterned features 415 may be or include tin oxide, silicon, silicon oxide, silicon oxynitride, or silicon-containing anti-reflective layer (SiARC), or tungsten. Although the remaining disclosure will regularly reference metal oxide photoresist, it is to be understood that the present technology may encompass additional materials on which selective deposition may be performed. Accordingly, it is to be understood that features 415 are not limited to metal oxide photoresist, and may be or include silicon oxide (SiO), silicon nitride (SiN), silicon carbide (SiC), tin oxide (SnO), silicon oxycarbide (SiOC), silicon oxycarbonitride (SiOCN), and crystalline silicon in embodiments encompassed by the present technology.

In embodiments, the patterned features 415 may overly a carbon-containing layer 410 deposited on the substrate 405. The carbon-containing layer 410 may be, for example, a spin-on carbon hardmask, chemical vapor deposited carbon, or plasma vapor deposited carbon. The carbon-containing layer 410 may be characterized by a thickness of greater than or about 20 nm, greater than or about 25 nm, greater than or about 30 nm, or more. Similarly, the carbon-containing layer 410 may be characterized by a thickness of less than or about 40 nm, less than or about 35 nm, less than or about 30 nm, or less. The one or more patterned features 415 may protrude greater than or about 5 nm from the carbon-containing layer 410, such as greater than or about 6 nm, greater than or about 7 nm, greater than or about 8 nm, greater than or about 9 nm, greater than or about 10 nm, or more. In embodiments, at least a portion of the layer of carbon-containing layer 410 may be exposed through the patterned features 415, such as the patterned metal-containing photoresist.

Figure 4A:
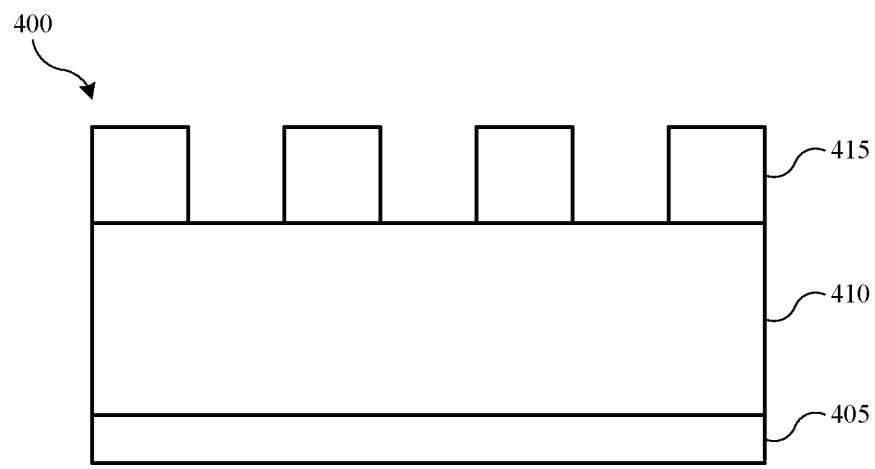
FIGS. 4A-4C show exemplary schematic cross-sectional structures in which material layers are included and produced according to some embodiments of the present technology.
Figure 4B:
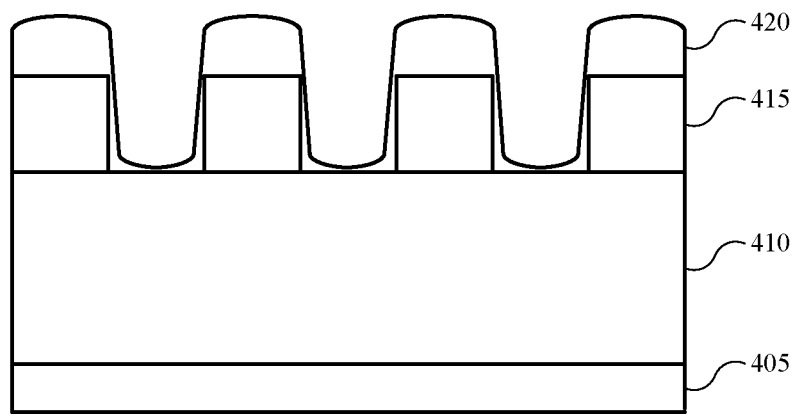
Figure 4C:
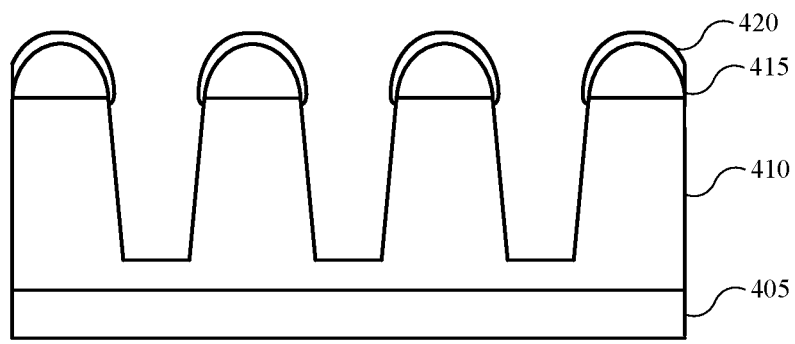

Referring to FIGS. 4A-4B, at operation 305, the method 300 may include providing a silicon-containing precursor to the processing region of the semiconductor processing chamber. Silicon-containing precursors that may be used in operation 305 may be or include any number of silicon-containing precursors. For example, the silicon-containing precursor may be or include silane ($SiH_4$), dislane ($Si_2H_6$), silicon tetrachloride ($SiCl_4$), or any other precursor able to form, for example, a silicon oxide (SiO), a silicon nitride (SiN), or a silicon carbide (SiC) material. The silicon-containing precursor selected may impact the deposition rate or the properties of the film. A flow rate of the silicon-containing precursor may be greater than or about 5 sccm, such as greater than or about 10 sccm, greater than or about 15 sccm, or more. The flow rate of the silicon-containing precursor may be tailored depending on the rate of the growth desired.

At operation 310, the method 300 may include providing a hydrogen-containing precursor to the processing region of the semiconductor processing chamber. Hydrogen-containing precursors that may be used in operation 310 may be or include any number of hydrogen-containing precursors, such as, but not limited to, diatomic hydrogen. A flow rate of the hydrogen-containing precursor may be greater than or about 40 sccm, such as greater than or about 50 sccm, greater than or about 60 sccm, or more.

The flow rates of the silicon-containing precursor and the hydrogen-containing precursor may be related. For example, the flow rate of the hydrogen-containing precursor may be maintained at a flow rate ratio relative to the silicon-containing precursor of greater than or about 1:1 while depositing a silicon-containing material 420, as described below. At higher flow rate ratios, selectivity of a silicon-containing material 420 may decrease and the deposition, described below, may decrease. At higher flow rate ratios, more silicon-containing precursor is being provided to the semiconductor processing chamber and, therefore, more silicon-containing material 420 is available for deposition. Further, depending on the silicon-containing precursor used, the silicon-containing material 420 to be deposited will have a lower Si at. % and may become richer in the other constituents of the silicon-containing precursor, which may not be selective to the patterned features 415. Accordingly, the flow rate ratio may be greater than or about 2:1, greater than or about 3:1, greater than or about 4:1, greater than or about 5:1, greater than or about 6:1, greater than or about 7:1, greater than or about 8:1, greater than or about 9:1, greater than or about 10:1, or more.

At operation 315, the method 300 may include forming a plasma. The plasma may be formed from the silicon-containing precursor and/or the hydrogen-containing precursor. Forming the plasma of the silicon-containing precursor and/or the hydrogen-containing precursor may be performed at a plasma power of less than or about 3,000 W. At higher plasma powers, line width may be difficult to maintain due to the energy of the radical effluents and etchant ability even during deposition operations. Additionally, the silicon-containing material 420 deposited on the patterned features 415 may quickly grow such that the resulting material on the patterned features 415 may be prone to toppling over. Further, at high plasma powers, the step time may shorten and it may be difficult to control the amount of deposition of the silicon-containing material 420. Accordingly, the plasma power may be maintained at less than or about 2,000 W, less than or about 1,000 W, less than or about 900 W, less than or about 800 W, less than or about 700 W, less than or about 600 W, less than or about 500 W, less than or about 400 W, less than or about 300 W, less than or about 200 W, or lower.

At operation 320, the method 300 may include depositing the silicon-containing material 420 on the one or more patterned features 415. The silicon-containing material 420 may be selectively deposited on the patterned material and not to the underlying carbon-containing layer 410, which may be based on the hydrogen interaction as will be discussed further below. However, it is contemplated that some silicon-containing material 420 may deposit on the carbon-containing layer 410. The silicon-containing material 420 may be deposited on the patterned features 415 at a rate of at least 2:1 relative to deposition on the exposed regions of the substrate 405, and may deposit on the patterned feature at a rate of greater than or about 5:1, greater than or about 10:1, greater than or about 15:1, greater than or about 20:1, or greater.

At operation 320, the method 200 may include applying a bias power to the plasma while depositing the silicon-containing material 420 on the one or more patterned features 415. The bias power may be less than or about 100 W. Application of bias power may be used to increase the selectively of deposition of the silicon-containing material 420 on the patterned features 415 instead of the exposed regions of the substrate 405, such as the carbon-containing layer 410. With bias, plasma effluents of the hydrogen-containing precursor may more readily react and interact with the carbon-containing layer 410, which may result in hydrogen not being sufficiently available at those locations to react with the silicon-containing precursor and, therefore, allowing silicon to bond with carbon. Without application of bias power, the silicon-containing material 420 may be less selective to the patterned features 415 and may be deposited more conformally. However, as bias power increases, the deposition rate of the silicon-containing material 420 may decrease and the already-deposited silicon-containing material 420 or patterned features 415 may potentially be etched during operation 320. Accordingly, the bias power may be applied at less than or about 90 W, less than or about 80 W, less than or about 70 W, less than or about 60 W, less than or about 50 W, less than or about 40 W, less than or about 30 W, less than or about 20 W, less than or about 10 W, or lower.

The bias power may be applied continuously or may be pulsed according to some embodiments of the present technology. In embodiments where the bias power is pulsed, the pulsing frequency may be less than or about 2,000 Hz, and may be pulsed at a frequency of less than or about 1,500 Hz, less than or about 1,000 Hz, less than or about 500 Hz, or less. Additionally, the duty cycle at the pulsing frequency may be maintained at less than or about 50%, and may be maintained at less than or about 40%, less than or about 30%, less than or about 20%, less than or about 10%, or less. This may further reduce the effective bias power being applied during the deposition operation. By utilizing an increased flow of the hydrogen-containing precursor relative to the silicon-containing precursor, a much lower bias power may be used to control formation on the carbon material, which may further limit etching of material deposited on the photoresist.

A temperature within the semiconductor processing chamber, such as a substrate support temperature, or a substrate temperature, may be maintained at less than or about 100° C. while depositing the silicon-containing material 420 on the one or more patterned features 415. At higher temperature, the deposition rate may decrease and the silicon-containing material 420 may deposit on the sidewalls of the patterned features 415. At higher temperatures, the silicon-containing material 420 may become more fluid and may not be able to deposit directly on top of the patterned features 415. Accordingly, the temperature may be maintained at less than or about 90° C., less than or about 80° C., less than or about 70° C., less than or about 60° C., less than or about 50° C., or lower.

A pressure within the semiconductor processing chamber 100 may be maintained at less than or about 50 mTorr while depositing the silicon-containing material 420 on the one or more patterned features 415. At higher pressure, the deposition may become more conformal and the silicon-containing material 420 may not selectively be deposited on the patterned material. Accordingly, in some embodiments, the pressure may be maintained at less than or about 40 mTorr, less than or about 30 mTorr, less than or about 20 mTorr, less than or about 10 mTorr, or less.

Referring to FIG. 4C, at optional operation 325, the method 300 may include an etching process. The etch process of optional operation 325 may occur in the same or a separate chamber as operation 320. Operation 325 may include etching one or more recesses into the carbon-containing layer 410 deposited on the substrate 405. More specifically, the etching process may include providing an oxygen-containing precursor, such as diatomic oxygen, to the processing region of the semiconductor processing chamber. After providing the oxygen-containing precursor, the process may include forming a plasma of the oxygen-containing precursor. Finally, the process may include etching the exposed regions of the carbon-containing layer 410 with the plasma of the oxygen-containing precursor to form recesses in the silicon-containing material 420. The etch process may also cause reduction or removal of the mask layer, due to bombardment or other interactions, although some or all of the silicon-containing material and the photoresist may remain during etching.

During the etching process of the present embodiments, the patterned feature may remain intact and the etching may provide vertical recesses due to the deposited silicon-containing material 420 described above. This may allow the structure 400 to be used in subsequent operations or in final products with improved structural integrity. Subsequent the etching, the recesses may be characterized by an undercut of less than or about 3 nm.

The etch process may be performed at increased processing powers compared to the deposition. For example, both a source and bias power may be increased within the processing chamber between the deposition operation and etching operation. For example, the source power may be increased from a power during deposition to a second power greater than or about 300 W, greater than or about 350 W, greater than or about 400 W, or greater. Similarly, the bias power may be increased from a first bias power during deposition to a second bias power of greater than or about 50 W, greater than or about 60 W, greater than or about 70 W, greater than or about 80 W, greater than or about 90 W, greater than or about 100 W, or greater. Additionally, the duty cycle applied to a bias pulsing frequency may be increased from a first duty cycle during deposition to a second duty cycle greater than or about 20%, greater than or about 30%, greater than or about 40%, greater than or about 50%, or greater. With decreased bias, the etching may result in a greater undercut due to increased isotropicity in the plasma. However, by increasing power between the deposition and etching, improved etch profiles may be afforded.

In conventional embodiments that do not deposit a silicon-containing material prior to the etch process, the final structure may suffer from decreased thickness of the patterned features remaining, or complete removal, and/or undercut of the etched recesses. Embodiments of the present disclosure may avoid or reduce these issues as described above. Due to the deposited silicon-containing material 420 described above, the present disclosure may reduce the amount of the patterned features 415 that is consumed during operation 325 and may allow bias power to be maintained during operation 325, which may lead to straighter sidewalls in the recesses.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a silicon-containing precursor" includes a plurality of such precursors, and reference to "the silicon-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   providing a silicon-containing precursor to a processing region of a semiconductor processing chamber, wherein a substrate is disposed within the processing region of the semiconductor processing chamber, and wherein the substrate comprises one or more patterned features separated by exposed regions of the substrate;
   providing a hydrogen-containing precursor to the processing region of the semiconductor processing chamber;
   forming a plasma of the silicon-containing precursor and the hydrogen-containing precursor, wherein forming the plasma of the silicon-containing precursor and the hydrogen-containing precursor is performed at a plasma power of less than or about 1,000 W;
   depositing a silicon-containing material on the one or more patterned features, wherein the silicon-containing material as-deposited is deposited on the patterned features at a rate of at least 10:1 relative to deposition on the exposed regions of the substrate;
   applying a bias power to the processing region of the semiconductor processing chamber while depositing the silicon-containing material on the one or more patterned features, wherein the bias power is less than or about 100 W, wherein a pulsing frequency of the bias power is less than or about 2,000 Hz, and wherein a duty cycle of the bias power is less than 10%; and
   performing an etching process, wherein the plasma power, the bias power, and the duty cycle of the bias power are increased between depositing the silicon-containing material and performing the etching process.

2. The semiconductor processing method of claim 1, wherein the silicon-containing material is silicon tetrachloride ($SiCl_4$).

3. The semiconductor processing method of claim 1, wherein the one or more patterned features comprise tin oxide, silicon, silicon oxide, silicon oxynitride, or silicon-containing anti-reflective layer (SiARC).

4. The semiconductor processing method of claim 1, wherein the one or more patterned features overly a carbon-containing layer.

5. The semiconductor processing method of claim 4, wherein the one or more patterned features protrude greater than or about 5 nm from the carbon-containing layer.

6. The semiconductor processing method of claim 1, wherein a temperature within the semiconductor processing chamber is maintained at less than or about 100° C. while depositing the silicon-containing material on the one or more patterned features.

7. The semiconductor processing method of claim 1, wherein a pressure within the semiconductor processing chamber is maintained at less than 10 mTorr while depositing the silicon-containing material on the one or more patterned features.

8. The semiconductor processing method of claim 1, further comprising:
   providing an oxygen-containing precursor to the processing region of the semiconductor processing chamber;
   forming a plasma of the oxygen-containing precursor; and
   etching a portion of the silicon-containing material and the exposed regions of the substrate with the plasma of the oxygen-containing precursor to form recesses in the silicon-containing material, wherein subsequent the etching, the recesses are characterized by an undercut of less than or about 3 nm.

9. The semiconductor processing method of claim 8, wherein forming the plasma of the oxygen-containing precursor is performed at a plasma power of greater than or about 200 W.

10. A semiconductor processing method comprising:
    providing a silicon-containing precursor to a processing region of a semiconductor processing chamber, wherein a substrate is disposed within the processing region of the semiconductor processing chamber, and wherein the substrate defines one or more patterned features along the substrate;
    forming a plasma of the silicon-containing precursor, wherein forming the plasma of the silicon-containing precursor is performed at a plasma power of less than or about 1,000 W;
    depositing a discontinuous silicon-containing material on the substrate, wherein the discontinuous silicon-containing material is selectively deposited on the one or more patterned features along the substrate, and wherein a pressure within the semiconductor processing chamber is maintained at less than or about 30 mTorr while depositing the discontinuous silicon-containing material on the one or more patterned features;
    applying a bias power to the processing region of the semiconductor processing chamber while depositing the discontinuous silicon-containing material on the one or more patterned features, wherein the bias power is less than or about 100 W, and wherein a duty cycle of the bias power is less than 10%; and
    performing an etching process, wherein the plasma power, the bias power, and the duty cycle of the bias power are increased between depositing the discontinuous silicon-containing material and performing the etching process.

11. The semiconductor processing method of claim 10, wherein:

a temperature within the semiconductor processing chamber is maintained at less than or about 75° C. while depositing the discontinuous silicon-containing material.

12. The semiconductor processing method of claim 10, further comprising etching one or more recesses into a carbon-containing layer deposited on the substrate with a plasma of an oxygen-containing precursor subsequent depositing the discontinuous silicon-containing material on the substrate.

13. The semiconductor processing method of claim 12, wherein the oxygen-containing precursor comprises diatomic oxygen.

14. The semiconductor processing method of claim 12, wherein subsequent the etching, the one or more recesses are characterized by an undercut of less than or about 2 nm.

15. A semiconductor processing method comprising:
providing a silicon-containing precursor and a hydrogen-containing precursor to a processing region of a semiconductor processing chamber, wherein a substrate is disposed within the processing region of the semiconductor processing chamber, wherein the substrate comprises a layer of carbon-containing material, wherein the substrate comprises a patterned metal-containing photoresist overlying the layer of carbon-containing material, and wherein at least a portion of the layer of carbon-containing material is exposed through the patterned metal-containing photoresist;
forming a plasma of the silicon-containing precursor and the hydrogen-containing precursor, wherein forming the plasma of the silicon-containing precursor and the hydrogen-containing precursor is performed at a plasma power of less than or about 1,000 W;
depositing a silicon-containing material on the patterned metal-containing photoresist along the substrate;
applying a bias power to the processing region of the semiconductor processing chamber while depositing the silicon-containing material on the patterned metal-containing photoresist, wherein the bias power is less than or about 100 W, and wherein a duty cycle of the bias power is less than 10%;
providing an oxygen-containing precursor to the processing region of the semiconductor processing chamber;
forming a plasma of the oxygen-containing precursor; and
etching one or more recesses into the layer of carbon-containing material with the plasma of the oxygen-containing precursor, wherein the plasma power, the bias power, and the duty cycle of the bias power are increased between depositing the silicon-containing material and etching of one or more recesses into the layer of carbon-containing material.

16. The semiconductor processing method of claim 15, wherein the silicon-containing material is silicon tetrachloride ($SiCl_4$).

17. The semiconductor processing method of claim 15, further comprising reducing a pressure in the semiconductor processing chamber prior to providing the oxygen-containing precursor to the processing region of the semiconductor processing chamber.

18. The semiconductor processing method of claim 15, wherein forming the plasma of the oxygen-containing precursor is performed at a plasma power of greater than or about 300 W.

19. The semiconductor processing method of claim 15, wherein the bias power is greater than 0 W.

* * * * *